(12) United States Patent
Kim

(10) Patent No.: US 8,089,166 B2
(45) Date of Patent: Jan. 3, 2012

(54) INTEGRATED CIRCUIT PACKAGE WITH TOP PAD

(75) Inventor: OhSug Kim, AnYang-Si (KR)

(73) Assignee: Stats Chippac Ltd., Singapore (SG)

( * ) Notice: Subject to any disclaimer, the term of this patent is extended or adjusted under 35 U.S.C. 154(b) by 59 days.

(21) Appl. No.: 11/618,805

(22) Filed: Dec. 30, 2006

(65) Prior Publication Data

US 2008/0157401 A1 Jul. 3, 2008

(51) Int. Cl.
*H01L 23/28* (2006.01)

(52) U.S. Cl. . 257/787; 257/666; 257/670; 257/E23.046; 257/E23.047; 257/E23.084; 257/E23.116; 438/121; 438/124

(58) Field of Classification Search ........... 257/E23.052, 257/E23.092, E23.116, 667, 676, 666, 670, 257/E23.046–E23.048, 675; 438/124
See application file for complete search history.

(56) References Cited

U.S. PATENT DOCUMENTS

| | | | | |
|---|---|---|---|---|
| 4,803,540 A * | 2/1989 | Moyer et al. | ................... | 257/669 |
| 5,703,398 A * | 12/1997 | Sono et al. | ................... | 257/706 |
| 6,262,475 B1 | 7/2001 | Liu et al. | | |
| 6,274,927 B1 | 8/2001 | Glenn | | |
| 6,307,755 B1 * | 10/2001 | Williams et al. | ............... | 361/813 |
| 6,420,204 B2 | 7/2002 | Glenn | | |
| 6,458,617 B1 * | 10/2002 | Liao et al. | ........................ | 438/51 |
| 2002/0140061 A1 * | 10/2002 | Lee | ................................. | 257/666 |
| 2005/0161806 A1 | 7/2005 | Divakar et al. | | |
| 2005/0189626 A1 | 9/2005 | Xiaochun et al. | | |
| 2007/0080437 A1 * | 4/2007 | Marimuthu et al. | .......... | 257/676 |

* cited by examiner

*Primary Examiner* — A. Sefer
*Assistant Examiner* — Ermias Woldegeorgis
(74) *Attorney, Agent, or Firm* — Mikio Ishimaru

(57) ABSTRACT

An integrated circuit package system includes a bottom pad with a bottom tie bar, attaching an integrated circuit die over the bottom pad, attaching a top pad with a top tie bar, over the integrated circuit die, and applying an encapsulant wherein the top tie bar integral to the top pad, is exposed on a side of the encapsulant.

20 Claims, 5 Drawing Sheets

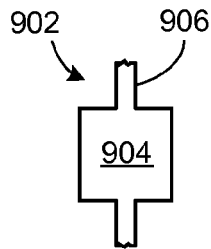
FIG. 9A
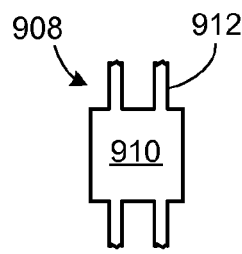
FIG. 9B
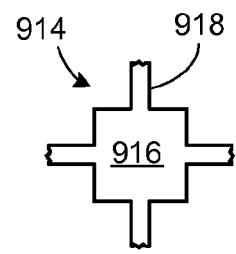
FIG. 9C
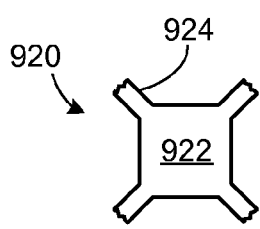
FIG. 9D
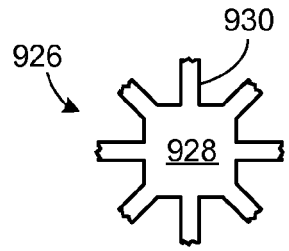
FIG. 9E
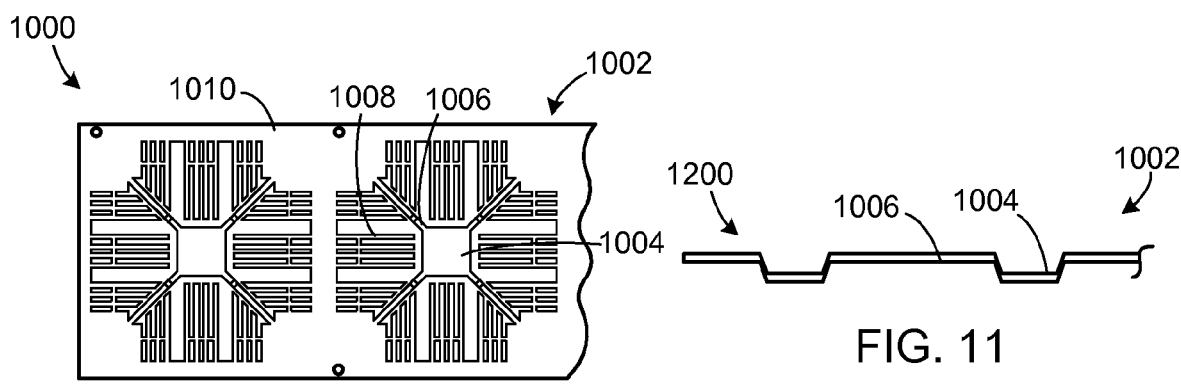
FIG. 10
FIG. 11
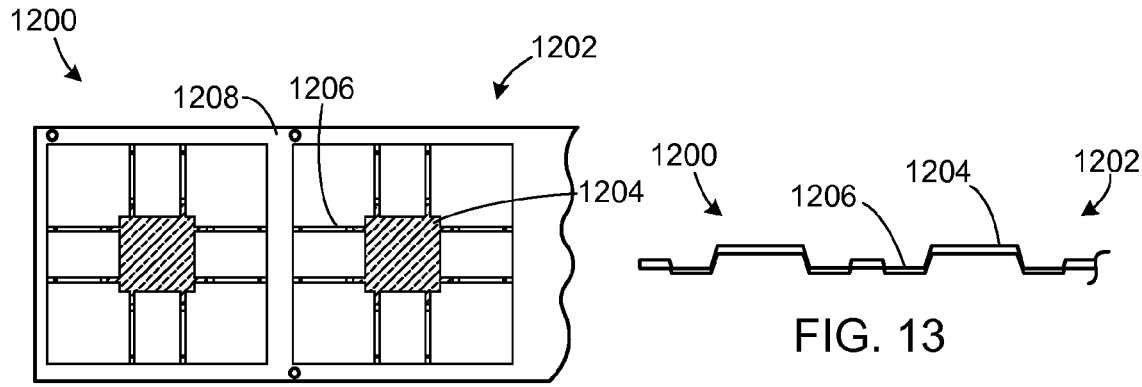
FIG. 12
FIG. 13

INTEGRATED CIRCUIT PACKAGE WITH TOP PAD

TECHNICAL FIELD

The present invention relates generally to integrated circuit package systems, and more particularly to a system for integrated circuit packages with pads.

BACKGROUND ART

It has become commonplace to rely on the convenience and utility of many electronic devices such as smart phones, personal digital assistants, location based devices, digital cameras, music players, computers, or transportation. Electronic devices have become such an integral part of many daily activities that all too often it is taken for granted just how much technology is involved in manufacturing and implementing integrated circuit devices. Many and various types of integrated circuit packaging for integrated circuit devices have been developed for protection, interconnection, or mounting.

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires that electrically connect pads on the integrated circuit die to individual leads of the leadframe, and a hard plastic encapsulant material that covers the other components and forms the exterior of the package.

The leadframe is the central supporting structure of such a package. A portion of the leadframe is internal to the package (i.e., completely surrounded by the plastic encapsulant). Some or all of the leads of the leadframe can extend beyond the extent of the package or at least provide partial exposure beyond the encapsulant material. This allows the package to be used in electrically connecting the package to another component or next system level. In certain integrated circuit packages, a portion of the die pad of the leadframe also remains exposed within the exterior extents of the package for use as a heat sink.

For purposes of high-volume, low-cost production of integrated circuit packages, a current industry practice is to etch or stamp a thin sheet of metal material to form a panel or strip that defines multiple lead frames. A single strip may be formed to include multiple arrays, with each such array including multiple leadframes in a pattern. In a typical integrated circuit package manufacturing process, the integrated circuit dies are mounted and wire bonded to individual leadframes, with the encapsulant material then being applied to the strip to encapsulate the integrated circuit dies, bond wires, and portions of each of the leadframes in the above-described manner. The hardening of the encapsulant material facilitates the formation of a mold cap upon the leadframes.

Upon the hardening of the encapsulant material, the leadframes within the strip are cut apart or singulated for purposes of producing the individual integrated circuit packages. Such singulation is typically accomplished via a saw singulation process. In this process, a saw blade is advanced along "saw streets" which extend in prescribed patterns between the leadframes as required to facilitate the separation of the leadframes from each other in the required manner. The advancement of the saw blade along the saw streets concurrently cuts the molded plastic mold cap, thus facilitating the formation of a molded plastic package body upon each of the separated leadframes.

Conventional lead frames generally lack structural rigidity. The finger-like or dangling portions of lead frames can be quite flimsy and difficult to hold in position. The die paddle while significantly larger can also be difficult to hold in position. Consequently, bond parameters have to be optimized to compensate for lead frame bouncing during the bonding process. A failure to design the components to compensate for the mechanical instability of the leadframe can result in structural instability, such as pad tilt.

As is well known in the field of integrated circuit packaging, a leadframe is used as a die carrier in an integrated circuit package for smaller footprint and lower manufacturing cost. However, during processing, an integrated circuit package is still subject to destabilizing forces, such as from a mold filling process. Further, after processing, an integrated circuit package is still subject to heat, both internal and external, and interference, such as electro magnetic (EMI). To date, integrated circuit packages have not successfully addressed these manufacturing, yield and performance issues. A new approach must be found in order to increase the manufacturing and performance of integrated circuit packages.

Thus, a need still remains for an integrated circuit package system to improve structural stability, heat transfer, and shielding. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a bottom pad with a bottom tie bar having bottom tie bar ends, wherein the bottom tie bar ends are arranged symmetrically around the bottom pad; attaching an integrated circuit die over the bottom pad; attaching a top pad with a top tie bar having tie bar ends, over the integrated circuit die wherein the top tie bars are arranged symmetrically around the top pad and in reference to the bottom pad, and applying an encapsulant wherein the top tie bar integral to the top pad, is exposed on a side of the encapsulant with the tie bar ends and the bottom tie bar ends extending beyond the encapsulant for forming package leads.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIGS. 9A, 9B, 9C, 9D, and 9E are top plan views of assembly configurations as examples in which tie bars and pads can be implemented in embodiments of the present invention;

FIG. 10 is a top plan view of a bottom strip as an example in which a strip level process can be implemented in an embodiment of the present invention;

FIG. 11 is a cross-sectional view of the structure of FIG. 10

FIG. 12 is a top plan view of a top strip as an example in which the strip level process can be implemented;

FIG. 13 is a cross-sectional view of the structure of FIG. 12;

BEST MODE FOR CARRYING OUT THE INVENTION

Figure 1:
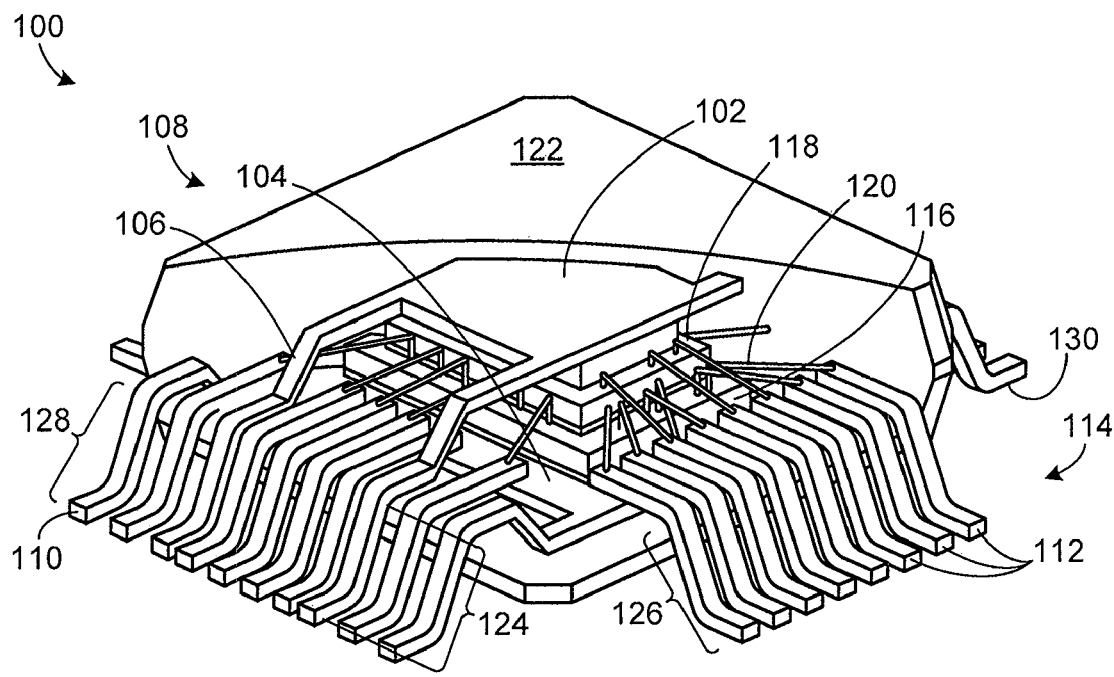
FIG. 1 is an isometric view of an integrated circuit package system in an encapsulating phase in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown an isometric view of an integrated circuit package system 100 in an encapsulating phase in an embodiment of the present invention. The integrated circuit package system 100 includes a top pad 102, such as a top metal pad, and a bottom pad 104, such as a bottom metal pad or die pad. The top pad 102 and top tie bars 106 are included in a top assembly 108, such as a lead frame. Similarly, the bottom pad 104, bottom tie bars 110, and bottom leads 112 are included in a bottom assembly 114, such as a lead frame.

The integrated circuit package system 100 can also include a first integrated circuit die 116 and a second integrated circuit die 118. The first integrated circuit die 116 and the second integrated circuit die 118 can be mounted over the bottom pad 104 and electrically connected to the bottom leads 112. Lead connectors 120, such as bond wires, can electrically connect the first integrated circuit die 116 or the second integrated circuit die 118 to the bottom leads 112.

The top pad 102 can be mounted over the first integrated circuit die 116 and the second integrated circuit die 118 such that the top tie bars 106 are adjacent to the bottom leads 112 or the bottom tie bars 110. The top tie bars 106 can be formed having a tie bar end 124 substantially the same shape as and parallel to a bottom lead end 126 of the bottom leads 112 or a bottom tie bar end 128 of the bottom tie bars 110. The tie bar ends 124, the bottom lead ends 126, and the bottom tie bar ends 128 are aligned laterally to one another, electrically isolated from one another, and shaped to provide coplanar contacts 130 which may be used for attaching the next level system (not shown), such as a printed circuit board. An encapsulant 122 can be applied over the top pad 102, the first integrated circuit die 116, the second integrated circuit die 118, the lead connectors 120, and the bottom pad 104. The encapsulant 122 can also be applied over a portion of the bottom tie bars 110, a portion of the bottom leads 112, or a portion of the top tie bars 106. The tie bar ends 124, the bottom lead ends 126, and the bottom tie bar ends 128 extend beyond the encapsulant 122 to form package leads.

It has been discovered that the integrated circuit package system 100 provides improved strength and structural integrity due to the top pad 102 and the bottom pad 104 preventing pad tilt.

Figure 2:
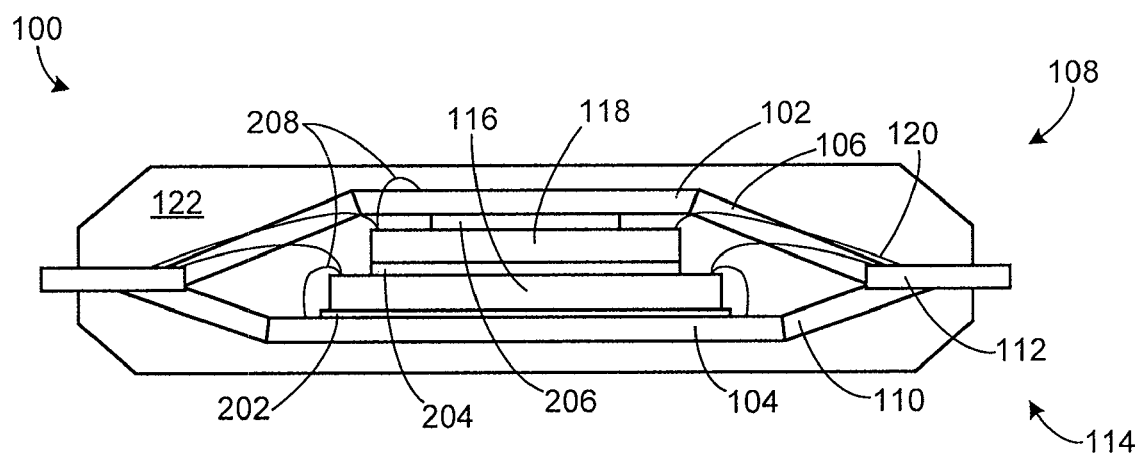
FIG. 2 is a cross-sectional view of the integrated circuit package system.

Referring now to FIG. 2, therein is shown a cross-sectional view of the integrated circuit package system 100. The integrated circuit package system 100 includes the top assembly 108, having the top pad 102 and the top tie bars 106 and the bottom assembly 114, having the bottom pad 104, the bottom tie bars 110, and the bottom leads 112.

A first attach layer 202, such as a paste adhesive or a film adhesive, mounts the first integrated circuit die 116 over the bottom pad 104. A second attach layer 204, such as a paste adhesive or a film adhesive, mounts the second integrated circuit die 118 over the first integrated circuit die 116. A mounting layer 206, such as a spacer, a paste adhesive, or a film adhesive, can be applied between the second integrated circuit die 118 and the top pad 102. The first attach layer 202, the second attach layer 204, and the mounting layer 206 can be formed of the same material, different material, or combination thereof.

The lead connectors 120 can connect to electrical signals through the bottom leads 112. Pad connectors 208, such as bond wires or other down bonds, can connect the first integrated circuit die 116 or the second integrated circuit die 118 to the top pad 102 or the bottom pad 104. The pad connectors 208 can connect to a supply, such as ground, through the top pad 102 or the bottom pad 104.

It has been discovered that the integrated circuit package system 100 provides improved thermal performance and electromagnetic interference protection with both the bottom pad 104 and the top pad 102, due in part to conductive materials.

Figure 3:
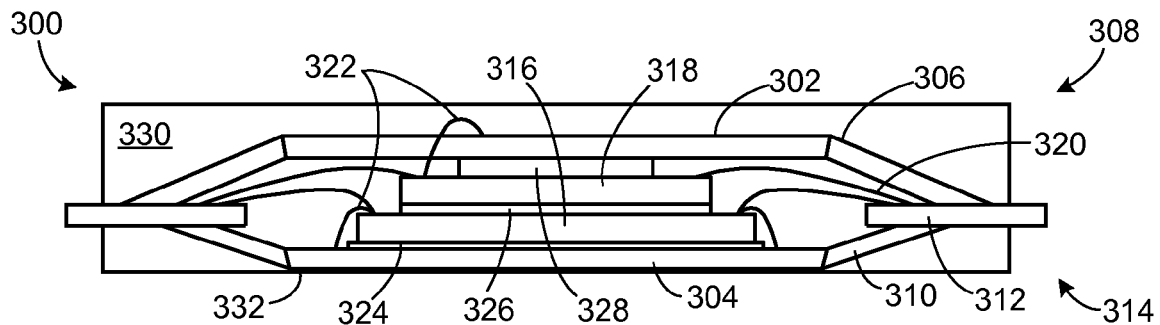
FIG. 3 is a cross-sectional view of an integrated circuit package system in an alternative embodiment of the present invention.

Referring now to FIG. 3, therein is shown a cross-sectional view of an integrated circuit package system 300 in an alternative embodiment of the present invention. In a manner similar to the integrated circuit package system 100 of FIG. 2, the integrated circuit package system 300 includes a top pad 302, such as a top metal pad, and a bottom pad 304, such as a bottom metal pad or deep downset exposed die pad. The top pad 302 and top tie bars 306 are included in a top assembly 308. Similarly, the bottom pad 304, bottom tie bars 310, and bottom leads 312 are included in a bottom assembly 314.

The integrated circuit package system 300 can also include a first integrated circuit die 316 and a second integrated circuit die 318. The first integrated circuit die 316 and the second integrated circuit die 318 can be mounted over the bottom pad 304 and electrically connected to the bottom leads 312. Lead connectors 320, such as bond wires, can electrically connect the first integrated circuit die 316 or the second integrated circuit die 318 to the bottom leads 312. Pad connectors 322, such as bond wires or other down bonds, can connect the first integrated circuit die 316 or the second integrated circuit die 318 to the top pad 302 or the bottom pad 304. The pad connectors 322 can connect to a supply, such as ground, through the top pad 302 or the bottom pad 304.

A first attach layer 324 mounts the first integrated circuit die 316 over the bottom pad 304. A second attach layer 326 mounts the second integrated circuit die 318 over the first integrated circuit die 316. A mounting layer 328, such as a spacer or an adhesive, can be applied between the second integrated circuit die 318 and the top pad 302. The first attach layer 324, the second attach layer 326, and the mounting layer 328 can be formed of the same material, different material, or combination thereof.

An encapsulant 330 can be applied over the top pad 302, the first integrated circuit die 316, the second integrated circuit die 318, and the lead connectors 320. The encapsulant 330 can also be applied over a portion of the bottom tie bars 310, a portion of the bottom leads 312, a portion of the top tie bars 306, or a portion of the bottom pad 304. The encapsulant 330 is not applied over a bottom pad lower surface 332 providing the bottom pad lower surface 332 substantially exposed.

The integrated circuit package system 300 provides improved thermal performance, such as heat conduction, improved electrical performance, such as increased ground signal connections, and improved electromagnetic interference protection.

Figure 4:
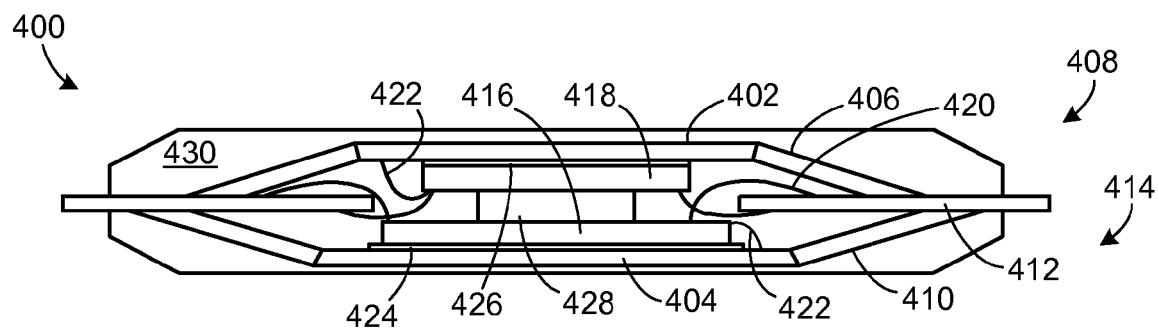
FIG. 4 is a cross-sectional view of an integrated circuit package system in another alternative embodiment of the present invention.

Referring now to FIG. 4 therein is shown a cross-sectional view of an integrated circuit package system 400 in another alternative embodiment of the present invention. In a manner similar to the integrated circuit package system 100 of FIG. 2, the integrated circuit package system 400 includes a top pad 402, such as a top metal pad, and a bottom pad 404, such as a bottom metal pad or deep downset exposed die pad. The top pad 402 and top tie bars 406 are included in a top assembly 408. Similarly, the bottom pad 404, bottom tie bars 410, and bottom leads 412 are included in a bottom assembly 414.

The integrated circuit package system 400 can also include a first integrated circuit die 416 and a second integrated circuit die 418. The first integrated circuit die 416 and the second integrated circuit die 418 can be electrically connected to the bottom leads 412. Lead connectors 420, such as bond wires, can electrically connect the first integrated circuit die 416 or the second integrated circuit die 418 to the bottom leads 412. Pad connectors 422, such as bond wires or other down bonds, can connect the first integrated circuit die 416 or the second integrated circuit die 418 to the top pad 402 or the bottom pad 404. The pad connectors 422 can connect to a supply, such as ground, through the top pad 402 or the bottom pad 404.

A first attach layer 424 mounts the first integrated circuit die 416 over the bottom pad 404. A second attach layer 426 mounts the second integrated circuit die 418 over the top pad 402. A mounting layer 428, such as a spacer or an adhesive, can be applied between the first integrated circuit die 416 and the second integrated circuit die 418. The first attach layer 424, the second attach layer 426, and the mounting layer 428 can be formed of the same material, different material, or combination thereof.

An encapsulant 430 can be applied over the top pad 402, the first integrated circuit die 416, the second integrated circuit die 418, the lead connectors 420, and the bottom pad 404. The encapsulant 430 can also be applied over a portion of the bottom tie bars 410, a portion of the bottom leads 412, or a portion of the top tie bars 406.

The integrated circuit package system 400 provides improved thermal performance, such as heat convection, improved electrical performance, such as increased ground signal connections, and improved electromagnetic interference protection.

Figure 5:
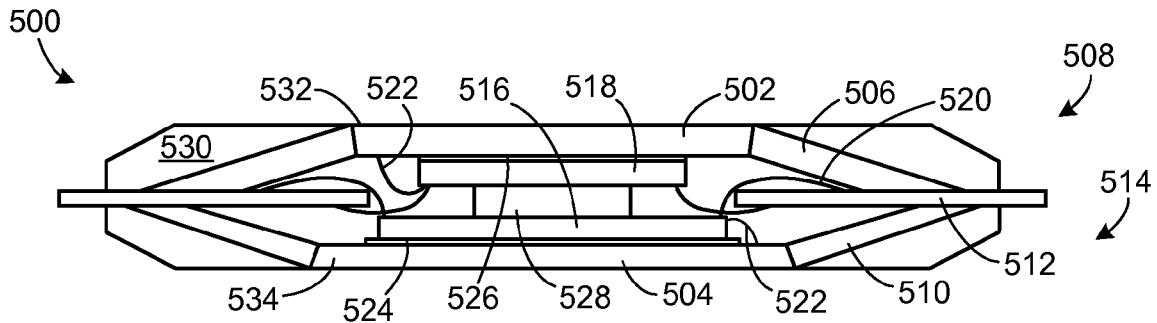
FIG. 5 is a cross-sectional view of an integrated circuit package system in yet another alternative embodiment of the present invention.

Referring now to FIG. 5, therein is shown a cross-sectional view of an integrated circuit package system 500 in yet another alternative embodiment of the present invention. In a manner similar to the integrated circuit package system 100 of FIG. 1, the integrated circuit package system 500 includes a top pad 502, such as a top metal pad, and a bottom pad 504, such as a bottom metal pad or deep downset exposed die pad. The top pad 502 and top tie bars 506 are included in a top assembly 508. Similarly, the bottom pad 504, bottom tie bars 510, and bottom leads 512 are included in a bottom assembly 514.

The integrated circuit package system 500 can also include a first integrated circuit die 516 and a second integrated circuit die 518. The first integrated circuit die 516 and the second integrated circuit die 518 can be electrically connected to the bottom leads 512. Lead connectors 520, such as bond wires, can electrically connect the first integrated circuit die 516 or the second integrated circuit die 518 to the bottom leads 512. Pad connectors 522, such as bond wires or other down bonds, can connect the first integrated circuit die 516 or the second integrated circuit die 518 to the top pad 502 or the bottom pad 504. The pad connectors 522 can connect to a supply, such as ground, through the top pad 502 or the bottom pad 504.

A first attach layer 524 mounts the first integrated circuit die 516 over the bottom pad 504. A second attach layer 526 mounts the second integrated circuit die 518 over the top pad 502. A mounting layer 528, such as a spacer or an adhesive, can be applied between the first integrated circuit die 516 and the second integrated circuit die 518. The first attach layer 524, the second attach layer 526, and the mounting layer 528 can be formed of the same material, different material, or combination thereof.

An encapsulant 530 can be applied over the first integrated circuit die 516, the second integrated circuit die 518, and the lead connectors 520. The encapsulant 530 can also be applied over a portion of the bottom tie bars 510, a portion of the bottom leads 512, a portion of the top tie bars 506, a portion of the top pad 502, or a portion of the bottom pad 504. The encapsulant 530 is not applied over a top pad upper surface 532 providing the top pad upper surface 532 substantially exposed. Similarly, the encapsulant 530 is not applied over a bottom pad lower surface 534 providing the bottom pad lower surface 534 substantially exposed.

The integrated circuit package system 500 provides improved thermal performance, such as heat conduction, improved electrical performance, such as increased ground signal connections, and improved electromagnetic interference protection.

Figure 6:
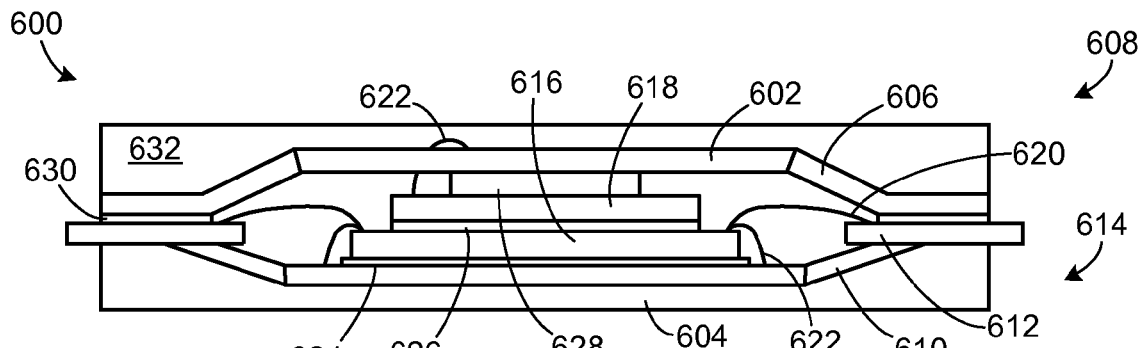
FIG. 6 is a cross-sectional view of an integrated circuit package system in yet another alternative embodiment of the present invention.

Referring now to FIG. 6, therein is shown a cross-sectional view of an integrated circuit package system 600 in yet another alternative embodiment of the present invention. In a manner similar to the integrated circuit package system 100 of FIG. 1, the integrated circuit package system 600 includes a top pad 602, such as a top metal pad, and a bottom pad 604, such as a bottom metal pad or deep downset exposed die pad. The top pad 602 and top tie bars 606 are included in a top assembly 608. Similarly, the bottom pad 604, bottom tie bars 610, and bottom leads 612 are included in a bottom assembly 614.

The integrated circuit package system 600 can also include a first integrated circuit die 616 and a second integrated circuit die 618. The first integrated circuit die 616 and the second integrated circuit die 618 can be mounted over the bottom pad 604 and electrically connected to the bottom leads 612. Lead connectors 620, such as bond wires, can electrically connect the first integrated circuit die 616 or the second integrated circuit die 618 to the bottom leads 612. Pad connectors 622, such as bond wires or other down bonds, can connect the first integrated circuit die 616 or the second integrated circuit die 618 to the top pad 602 or the bottom pad 604. The pad connectors 622 can connect to a supply, such as ground, through the top pad 602 or the bottom pad 604.

A first attach layer 624 mounts the first integrated circuit die 616 over the bottom pad 604. A second attach layer 626 mounts the second integrated circuit die 618 over the first integrated circuit die 616. A mounting layer 628, such as a spacer or an adhesive, can be applied between the second integrated circuit die 618 and the top pad 602. The first attach layer 624, the second attach layer 626, and the mounting layer 628 can be formed of the same material, different material, or combination thereof.

A tie bar attach layer 630, such as a film adhesive or a paste adhesive can provide mounting for the top assembly 608 having the top tie bars 606. A portion of the top tie bars 606 can be mounted over a portion of the bottom tie bars 610. The tie bar attach layer 630 can be applied between the top tie bars 606 and the bottom tie bars 610 providing a substantially fixed position for the top assembly 608 and the bottom assembly 614.

An encapsulant 632 can be applied over the top pad 602, the first integrated circuit die 616, the second integrated circuit die 618, the lead connectors 620, and the bottom pad 604. The encapsulant 632 can also be applied over a portion of the bottom tie bars 610, a portion of the bottom leads 612, or a portion of the top tie bars 606.

Figure 7:
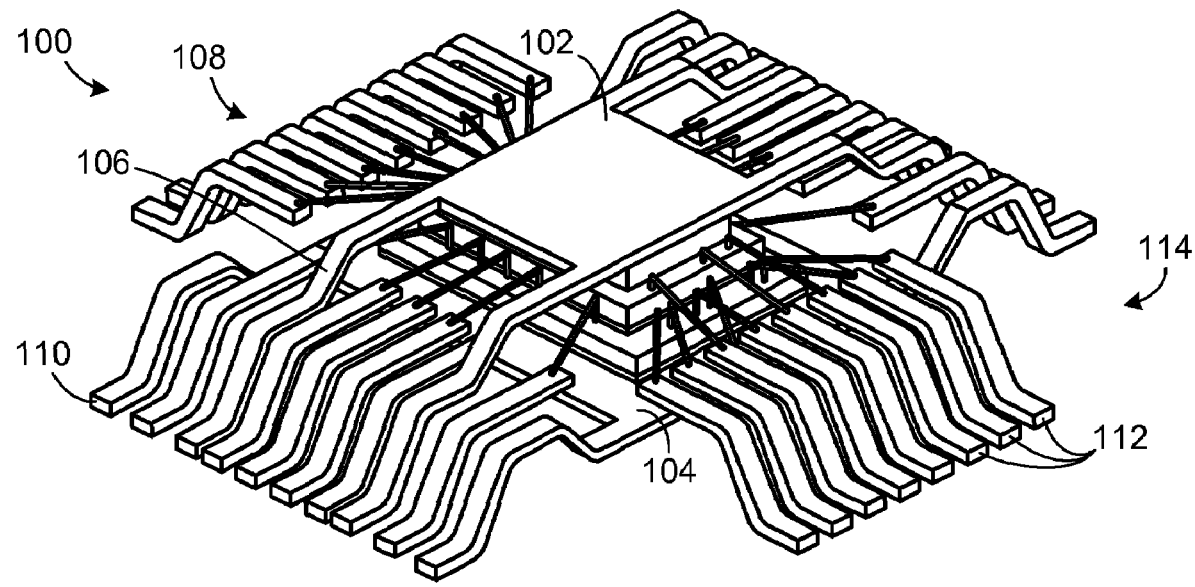
FIG. 7 is an isometric view of the integrated circuit package system in a pad mounting phase.

Referring now to FIG. 7, therein is shown an isometric view of the integrated circuit package system 100 in a pad mounting phase. The integrated circuit package system 100 includes the top pad 102 and the bottom pad 104. The top pad 102 and the top tie bars 106 are included in the top assembly 108. The top assembly 108 can be formed as a unit having the top pad 102 and the top tie bars 106 as integral elements, such as those formed by a stamping process of a contiguous material or an etching process applied to a contiguous material.

Similarly, the bottom pad 104, the bottom tie bars 110, and the bottom leads 112 are included in the bottom assembly 114. The bottom assembly 114 can also be formed as a unit having the bottom pad 104 and the bottom tie bars 110 as integral elements, such as formed by a stamping or etching process applied to a contiguous or homogenous material.

The top assembly 108 is mounted with the top tie bars 106 parallel to the bottom tie bars 110 of the bottom assembly 114. The top tie bars 106 can be parallel and adjacent to the bottom tie bars 110 or the bottom leads 112 on a side of the bottom assembly 114 having the bottom tie bars 110.

Figure 8:
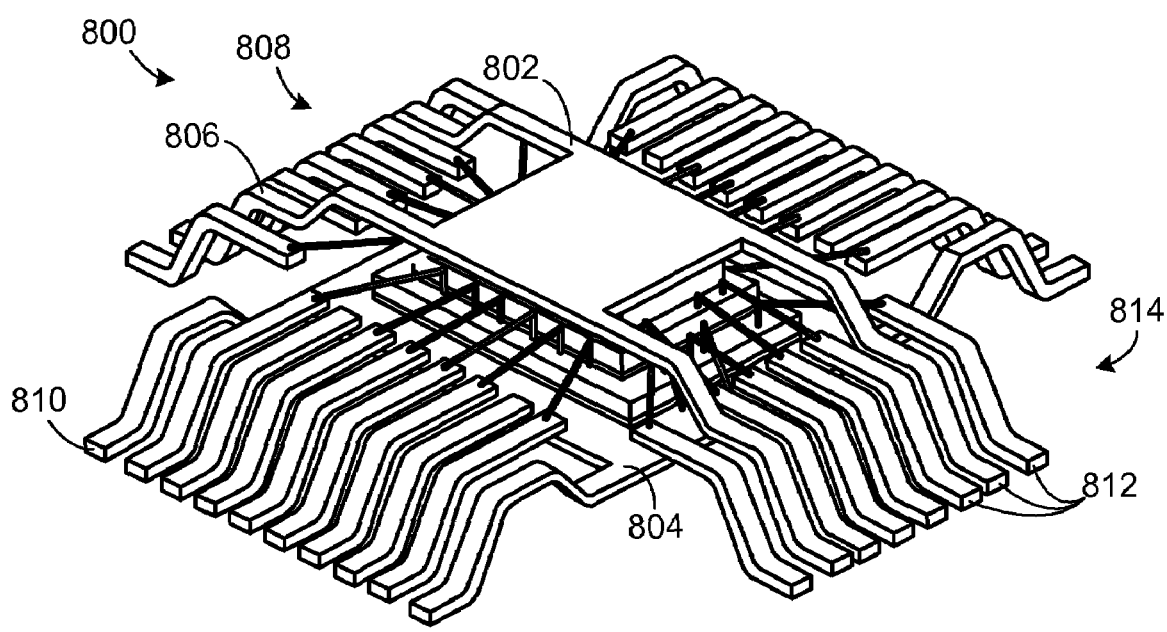
FIG. 8 is an isometric view of an integrated circuit package system in a pad mounting phase in yet another alternative embodiment of the present invention.

Referring now to FIG. 8, therein is shown an isometric view of an integrated circuit package system 800 in a pad mounting phase in yet another alternative embodiment of the present invention. The integrated circuit package system 800 includes a top pad 802 and a bottom pad 804. The top pad 802 and top tie bars 806 are included in a top assembly 808. The top assembly 808 can be formed as a unit having the top pad 802 and the top tie bars 806 as integral elements, such as those formed by a stamping process or an etching process applied to a contiguous or homogenous material.

Similarly, the bottom pad 804, bottom tie bars 810, and bottom leads 812 are included in a bottom assembly 814. The bottom assembly 814 can also be formed as a unit having the bottom pad 804 and the bottom tie bars 810 as integral elements, such as formed by a stamping or etching process applied to a contiguous or homogenous material.

The top assembly 808 is mounted with the top tie bars 806 orthogonal to the bottom tie bars 810 of the bottom assembly 814. The top tie bars 806 can be parallel and adjacent to the bottom leads 812 on a side of the bottom assembly 814 orthogonal to a side of the bottom assembly 814 having the bottom tie bars 810.

Referring now to FIGS. 9A, 9B, 9C, 9D, and 9E, therein are shown top plan views of assembly configurations as examples in which tie bars and pads can be implemented in embodiments of the present invention. The tie bars and pads can be formed with or without chemical surface treatments, such as an oxidation process, or mechanical surface treatment, such as dimple formation process.

A first top assembly 902 includes a first top pad 904 and first top tie bars 906. The first top tie bars 906 are arranged symmetrically around the first top pad 904. One each of the first top tie bars 906 can be formed on each of two sides of the first top pad 904 opposite one another. The first top tie bars 906 can be substantially orthogonal to the side of the first top pad 904 from which each of the first top tie bars 906 extend. The term "symmetrical" as used herein is defined as correspondence in size, shape, and relative position of parts on opposite sides of a dividing line or median plane or about a center or axis. In the first top assembly 902, the first top tie bars 906 are symmetrical about the two axes of symmetry orthogonal to the sides of the first top pad 904.

A second top assembly 908 includes a second top pad 910 and second top tie bars 912. The second top tie bars 912 are arranged symmetrically around the second top pad 910. More specifically, the second top tie bars 912 are symmetrical about the two axes of symmetry orthogonal to the sides of the second top pad 910. Two each of the second top tie bars 912 can be formed on each of two sides of the second top pad 910 opposite one another. The second top tie bars 912 can be substantially orthogonal to the side of the second top pad 910 from which the second top tie bars 912 extend.

A third top assembly 914 includes a third top pad 916 and third top tie bars 918. The third top tie bars 918 are arranged symmetrically around the third top pad 916. More specifically, the third top tie bars 918 are symmetrical about the two axes of symmetry orthogonal to the sides of the third top pad 916. One each of the third top tie bars 918 can be formed on each of the four sides of the third top pad 916. The third top tie bars 918 can be substantially orthogonal to the side of the third top pad 916 from which each of the third top tie bars 918 extend.

A fourth top assembly 920 includes a fourth top pad 922 and fourth top tie bars 924. The fourth top tie bars 924 are arranged symmetrically around the fourth top pad 922. More specifically, the fourth top tie bars 924 are symmetrical about the two axes of symmetry orthogonal to the sides of the fourth top pad 922. One each of the fourth top tie bars 924 can be formed on each of the corners of the fourth top pad 922. The fourth top tie bars 924 can be substantially aligned to a polygon diagonal of the fourth top pad 922 through a vertex from which each of the fourth top tie bars 924 extend.

A fifth top assembly 926 includes a fifth top pad 928 and fifth top tie bars 930. The fifth top tie bars 930 are arranged symmetrically around the fifth top pad 928. More specifically, the fifth top tie bars 930 are symmetrical about the two axes of symmetry orthogonal to the sides of the fifth ton pad 928. One each of the fifth top tie bars 930 can be formed on each of the sides of the fifth top pad 928 and on each of the corners of the fifth top pad 928. The fifth top tie bars 930 can be substantially orthogonal to the side of the fifth top pad 928 from which the fifth top tie bars 930 extend, or substantially aligned to a polygon diagonal of the fifth top pad 928 through a vertex from which the fifth top tie bars 930 extends.

Referring now to FIG. 10, therein is shown a top plan view of a bottom strip 1000 as an example in which a strip level process can be implemented in an embodiment of the present invention. The bottom strip 1000 includes a bottom assembly 1002. The bottom assembly 1002 includes bottom pads 1004, bottom tie bars 1006, bottom leads 1008, and a bottom frame 1010. The bottom tie bars 1006 in the bottom strip 1000 are arranged symmetrically around the bottom pads 1004. For illustrative purposes, two of the bottom assembly 1002 are shown although it is understood that any number of the bottom assembly 1002 may be included. Further, for illustrative purposes, the bottom strip 1000 is shown have one row of the bottom assembly 1002 although it is understood that other configurations may be used.

Referring now to FIG. 11, therein is shown a cross-sectional view of the structure of FIG. 10. The bottom strip 1000 includes the bottom pads 1004 and the bottom tie bars 1006. The bottom tie bars 1006 are formed substantially in a plane. The bottom pads 1004, such as downset pads or deep downset pads, can be formed below the plane of the bottom tie bars 1006. The bottom pads 1004 can provide improved thermal performance by heat convection or conduction, or improved electrical performance by increased ground signal connections.

Referring now to FIG. 12, therein is shown a top plan view of a top strip 1200 as an example in which the strip level process can be implemented. The top strip 1200 includes a top assembly 1202. The top assembly 1202 includes top pads 1204, top tie bars 1206, and a top frame 1208. The top tie bars 1206 in the top strip 1200 are arranged symmetrically around the top pads 1204. For illustrative purposes, two of the top assembly 1202 are shown although it is understood that any number of the top assembly 1202 may be included. Further, for illustrative purposes, the top strip 1200 is shown have one row of the top assembly 1202 although it is understood that other configurations may be used.

Referring now to FIG. 13, therein is shown a cross-sectional view of the structure of FIG. 12. The top strip 1200 includes the top pads 1204 and the top tie bars 1206. The top tie bars 1206 are formed substantially in a plane. The top pads 1204 can be formed above the plane of the top tie bars 1206. The top pads 1204 can provide improved thermal performance by heat convection or conduction, improved electrical performance by increased ground signal connections, or improved electromagnetic interference protection.

Figure 14:
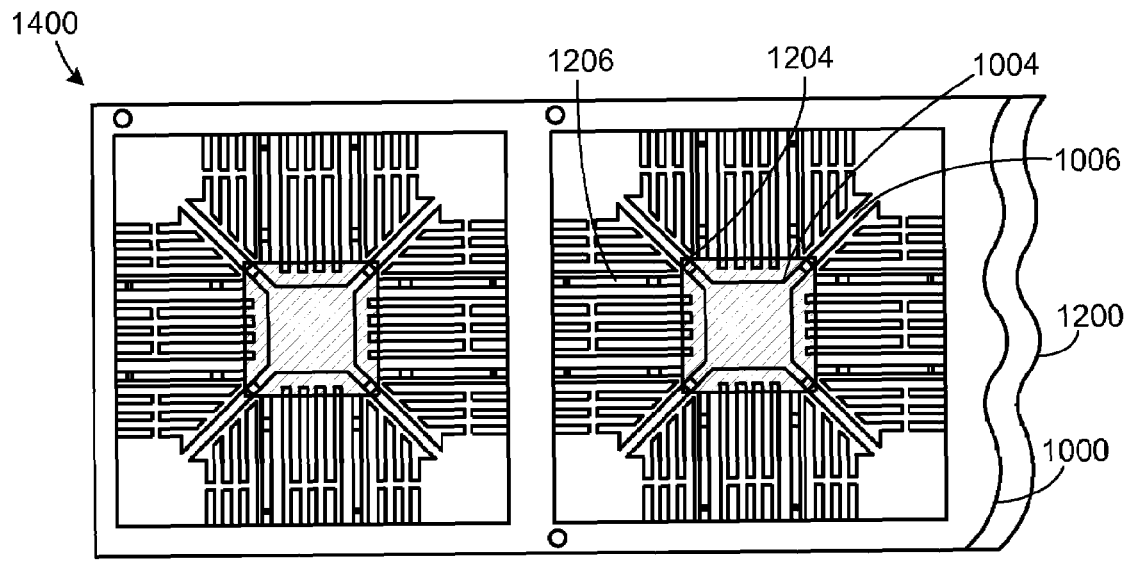
FIG. 14 is a top plan view of a leadframe assembly as an example in which the strip level process can be implemented.

Referring now to FIG. 14, therein is shown a top plan view of a leadframe assembly 1400 as an example in which the strip level process can be implemented. The leadframe assembly 1400 includes the bottom strip 1000 having the bottom pads 1004 and the bottom tie bars 1006. As seen in FIG. 12, the bottom tie bars 1006 are arranged symmetrically around the bottom pads 1004. The leadframe assembly 1400 also includes the top strip 1200 including the top pads 1204 and the top tie bars 1206. The top tie bars 1206 are arranged symmetrically around the top pads 1204 and in reference to the bottom pads 1004. The leadframe assembly can be applied to other package types, such as dual packages or quad packages.

Figure 15:
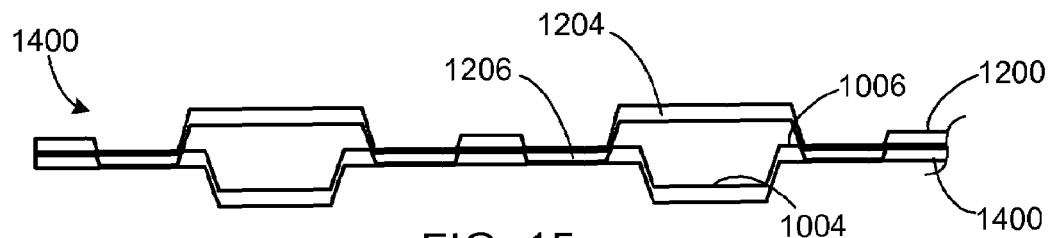
FIG. 15 is a cross-sectional view of the structure of FIG. 14.

Referring now to FIG. 15, therein is shown a cross-sectional view of the structure of FIG. 14. The top pads 1204 are positioned over the bottom pads 1004. The top tie bars 1206 can be placed over or adjacent to the bottom tie bars 1006. The top tie bars 1206 and the bottom tie bars 1006 can provide a clamp region for a mold chase during processing such as encapsulation, transfer molding, or a transport mold process. The leadframe assembly can be processed by qualified assembly technology decreasing cost of development and time.

Figure 16:
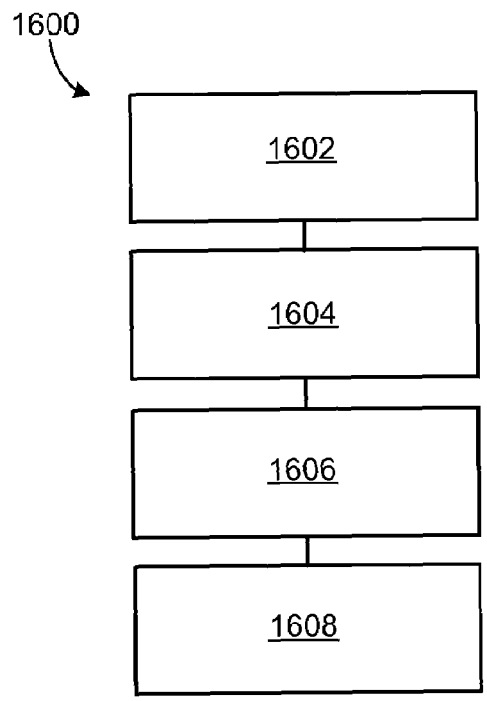
FIG. 16 is a flow chart of an integrated circuit package system for manufacturing the integrated circuit package system in an embodiment of the present invention.

Referring now to FIG. 16, therein is shown a flow chart of an integrated circuit package system 1600 for manufacturing the integrated circuit package system 100 in an embodiment of the present invention. The system 1600 includes forming a bottom pad with a bottom tie bars having bottom tie bar ends, wherein the bottom tie bars are arranged symmetrically around the bottom pad in a block 1602; attaching an integrated circuit die over the bottom pad in a block 1604; attaching a top pad with top tie bars having tie bar ends, over the integrated circuit die, wherein the ton tie bars are arranged symmetrically around the top pad and in reference to the bottom pad in a block 1606; and applying an encapsulant wherein the top tie bars integral to the top pad, are exposed on a side of the encapsulant with the tie bar ends and the bottom tie bar ends extending beyond the encapsulant for forming package leads.

In greater detail, a system to provide the method and apparatus of the integrated circuit package system 100, in an embodiment of the present invention, is performed as follows:
1. Forming a bottom assembly having a bottom pad with a bottom tie bar.
2. Mounting an integrated circuit die over the bottom pad with the bottom tie bar.
3. Mounting a top pad having a top tie bar near the bottom tie bar and the top pad over the integrated circuit die.
4. Forming an encapsulant wherein the top tie bar integral to the top pad and the bottom tie bar are exposed on a side of the encapsulant Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   forming a bottom pad with bottom tie bars having bottom tie bar ends, wherein the bottom tie bars are arranged symmetrically around the bottom pad;
   attaching an integrated circuit die over the bottom pad;
   attaching a top pad with top tie bars having tie bar ends, over the integrated circuit die, wherein the top tie bars are arranged symmetrically around the top pad and in reference to the bottom pad; and
   applying an encapsulant wherein the top tie bars and the bottom tie bars are exposed on a side of the encapsulant for forming package leads with the tie bar ends parallel to, aligned laterally to, and electrically isolated from the bottom tie bar ends extending beyond the encapsulant including shaping the tie bar ends and the bottom tie bar ends for providing coplanar contacts adjacent to a bottom lead end.

2. The method as claimed in claim 1 wherein forming the bottom pad includes forming a deep down set pad.

3. The method as claimed in claim 1 wherein attaching the top pad includes forming the tie bar ends and bottom tie bar ends parallel to the bottom lead ends.

4. The method as claimed in claim 1 wherein attaching the integrated circuit die includes applying an attach layer over the integrated circuit die.

5. The method as claimed in claim 1 wherein attaching the integrated circuit die includes attaching a second integrated circuit die over the integrated circuit die.

6. A method of manufacturing an integrated circuit package system comprising:
   forming a bottom assembly having a bottom pad with bottom tie bars having bottom tie bar ends, wherein the bottom tie bars are arranged symmetrically around the bottom pad;
   mounting an integrated circuit die over the bottom pad in the bottom assembly;
   forming a top assembly incorporating a top pad with top tie bars having tie bar ends, wherein the top tie bars are arranged symmetrically around the top pad;
   mounting the top assembly over the integrated circuit die placing the top tie bars near the bottom tie bars; and
   forming an encapsulant wherein the top tie bars, integral to the top pad, and the bottom tie bars are exposed on a side of the encapsulant with the tie bar ends parallel to, aligned laterally to, and electrically isolated from the bottom tie bar ends extending beyond the encapsulant for forming package leads including shaping the tie bar ends and the bottom tie bar ends for providing coplanar contacts adjacent to a bottom lead end.

7. The method as claimed in claim 6 wherein forming the bottom assembly includes forming a deep down set pad for heat conduction.

8. The method as claimed in claim 6 wherein mounting the top assembly includes forming the tie bar ends and bottom tie bar ends parallel to the bottom lead ends.

9. The method as claimed in claim 6 wherein forming the encapsulant includes forming the encapsulant with the bottom pad and the top pad partially exposed.

10. The method as claimed in claim 6 wherein mounting the top assembly over the integrated circuit die includes attaching a second integrated circuit die under the top pad prior to mounting the top assembly over the integrated circuit die.

11. An integrated circuit package system comprising:
    a bottom pad with bottom tie bars having bottom tie bar ends, wherein the bottom tie bars are arranged symmetrically around the bottom pad;
    an integrated circuit die attached over the bottom pad;
    a top pad with top tie bars having tie bar ends, attached over the integrated circuit die, wherein the top tie bars are arranged symmetrically around the top pad and in reference to the bottom pad; and
    an encapsulant formed on the integrated circuit die, the top pad and the bottom pad includes the top tie bar ends, integral to the top pad, and the bottom tie bar ends are exposed on a side of the encapsulant with the top tie bar ends parallel to, aligned laterally to, and electrically isolated from the bottom tie bar ends extending beyond the encapsulant and shaped for providing coplanar contacts adjacent to a bottom lead end.

12. The system as claimed in claim 11 wherein the bottom pad is a deep down set pad.

13. The system as claimed in claim 11 wherein the top pad attached over the integrated circuit die includes the tie bar ends and bottom tie bar ends parallel to the bottom lead ends.

14. The system as claimed in claim 11 wherein the integrated circuit die includes an attach layer over the integrated circuit die.

15. The system as claimed in claim 11 wherein the integrated circuit die includes a second integrated circuit die over the integrated circuit die.

16. The system as claimed in claim 11 wherein:
    the bottom pad with the bottom tie bars are part of a bottom assembly;
    the top pad with the top tie bars are part of a top assembly; and
    the top tie bars are located near the bottom tie bars to include coplanar contacts formed by the tie bar ends and the bottom tie bar ends.

17. The system as claimed in claim 16 wherein the bottom assembly includes a deep down set pad for heat conduction.

18. The system as claimed in claim 16 wherein the top tie bars are located over the bottom tie bars.

19. The system as claimed in claim 16 wherein the encapsulant leaves the bottom pad and the top pad partially exposed.

20. The system as claimed in claim 16 wherein the top assembly includes a second integrated circuit attached under the top pad.

* * * * *

UNITED STATES PATENT AND TRADEMARK OFFICE
CERTIFICATE OF CORRECTION

PATENT NO. : 8,089,166 B2  
APPLICATION NO. : 11/618805  
DATED : January 3, 2012  
INVENTOR(S) : Kim Page 1 of 1

It is certified that error appears in the above-identified patent and that said Letters Patent is hereby corrected as shown below:

Column 9:
line 30, delete "the fifth ton pad 928." and insert therefor --the fifth top pad 928.--

Column 10:
line 43, delete "bottom pad with a bottom tie bars" and insert therefor --bottom pad with bottom tie bars-- lines 48-49, delete "the ton tie bars are arranged symmetrically" and insert therefor --the top tie bars are arranged symmetrically--

Signed and Sealed this  
Twenty-fifth Day of September, 2012

David J. Kappos  
*Director of the United States Patent and Trademark Office*